United States Patent
Ooki

(10) Patent No.: US 10,892,288 B2
(45) Date of Patent: Jan. 12, 2021

(54) SOLID STATE IMAGING DEVICE

(71) Applicants: Kabushiki Kaisha Toshiba, Tokyo (JP); Toshiba Electronic Devices & Storage Corporation, Tokyo (JP)

(72) Inventor: Masayuki Ooki, Yokohama Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 12 days.

(21) Appl. No.: 16/270,032

(22) Filed: Feb. 7, 2019

(65) Prior Publication Data
US 2020/0052015 A1 Feb. 13, 2020

(30) Foreign Application Priority Data
Aug. 13, 2018 (JP) ................ 2018-152297

(51) Int. Cl.
*H01L 27/146* (2006.01)
*H04N 5/3745* (2011.01)
*H04N 5/343* (2011.01)

(52) U.S. Cl.
CPC .. *H01L 27/14607* (2013.01); *H01L 27/14645* (2013.01); *H04N 5/37452* (2013.01); *H04N 5/343* (2013.01)

(58) Field of Classification Search
CPC ........ H01L 27/14607; H01L 27/14645; H04N 5/37452; H04N 5/343

USPC ....................................................... 257/440
See application file for complete search history.

(56) References Cited

U.S. PATENT DOCUMENTS

| 8,723,999 | B2 | 5/2014 | Kido et al. | |
|---|---|---|---|---|
| 8,860,099 | B2 | 10/2014 | Tatani et al. | |
| 9,111,834 | B2 | 8/2015 | Kido et al. | |
| 2005/0184322 | A1* | 8/2005 | Inoue | H01L 27/14601 257/292 |
| 2006/0231739 | A1 | 10/2006 | Sekine et al. | |
| 2008/0087800 | A1* | 4/2008 | Toda | H01L 27/14645 250/214 C |
| 2010/0207231 | A1* | 8/2010 | Iwamoto | H01L 27/14625 257/461 |
| 2010/0225792 | A1* | 9/2010 | Kumagai | H01L 27/14645 348/273 |
| 2011/0228149 | A1* | 9/2011 | Naruse | H01L 27/1463 348/273 |

(Continued)

FOREIGN PATENT DOCUMENTS

| JP | 2006-302970 A | 11/2006 |
|---|---|---|
| JP | 2016-40838 A | 3/2016 |

(Continued)

*Primary Examiner* — Sheikh Maruf
(74) *Attorney, Agent, or Firm* — White & Case LLP

(57) ABSTRACT

A solid state imaging device according to one embodiment, includes a first pixel and a second pixel adjacent to each other in a first direction. Structures of the first pixel and the second pixel are mutually mirror-symmetric. Each of the first pixel and the second pixel includes an opening region where light enters. The opening region of the first pixel is disposed over an entire width in the first direction of the first pixel. The opening region of the second pixel is disposed over an entire width in the first direction of the second pixel.

12 Claims, 6 Drawing Sheets

(56) References Cited

U.S. PATENT DOCUMENTS

| | | | | |
|---|---|---|---|---|
| 2012/0080765 A1* | 4/2012 | Ku | .................... | H01L 27/1464 |
| | | | | 257/432 |
| 2012/0146117 A1* | 6/2012 | Kuwazawa | ....... | H01L 27/14612 |
| | | | | 257/292 |
| 2012/0188425 A1* | 7/2012 | Kita | .................. | H04N 5/23212 |
| | | | | 348/294 |
| 2014/0253767 A1* | 9/2014 | Kato | ................ | H04N 9/04557 |
| | | | | 348/280 |
| 2014/0346628 A1* | 11/2014 | Okazaki | ............ | H01L 27/14627 |
| | | | | 257/432 |
| 2015/0084144 A1* | 3/2015 | Suzuki | .............. | H04N 9/04555 |
| | | | | 257/432 |
| 2016/0049438 A1* | 2/2016 | Murata | ............ | H01L 27/14603 |
| | | | | 257/229 |
| 2016/0172412 A1* | 6/2016 | Lee | ................... | H01L 27/14605 |
| | | | | 257/432 |
| 2017/0013211 A1 | 1/2017 | Kato et al. | | |
| 2017/0359539 A1* | 12/2017 | Kawabata | ......... | H01L 27/14623 |
| 2018/0088260 A1* | 3/2018 | Jin | .................... | G02F 1/134309 |
| 2019/0035839 A1* | 1/2019 | Byun | ................ | H01L 27/1463 |

FOREIGN PATENT DOCUMENTS

| | | |
|---|---|---|
| JP | 2016-54327 A | 4/2016 |
| JP | 2017-139498 A | 8/2017 |
| JP | 2017-175164 A | 9/2017 |

\* cited by examiner

SOLID STATE IMAGING DEVICE

CROSS-REFERENCE TO RELATED APPLICATIONS

This application is based upon and claims the benefit of priority from Japanese Patent Application No. 2018-152297, filed on Aug. 13, 2018; the entire contents of which are incorporated herein by reference.

FIELD

Embodiments relate to a solid state imaging device.

BACKGROUND

Multiple pixels are arranged in a matrix configuration in a solid state imaging device such as a CMOS sensor, etc. In a high-resolution imaging mode, one pixel is driven as one imaging element; and in a high-sensitivity imaging mode, two mutually-adjacent pixels are driven as one imaging element.

DETAILED DESCRIPTION

A solid state imaging device according to one embodiment, includes a first pixel and a second pixel adjacent to each other in a first direction. Structures of the first pixel and the second pixel are mutually mirror-symmetric. Each of the first pixel and the second pixel includes an opening region where light enters. The opening region of the first pixel is disposed over an entire width in the first direction of the first pixel. The opening region of the second pixel is disposed over an entire width in the first direction of the second pixel.

First Embodiment

A first embodiment will now be described.

Figure 1:
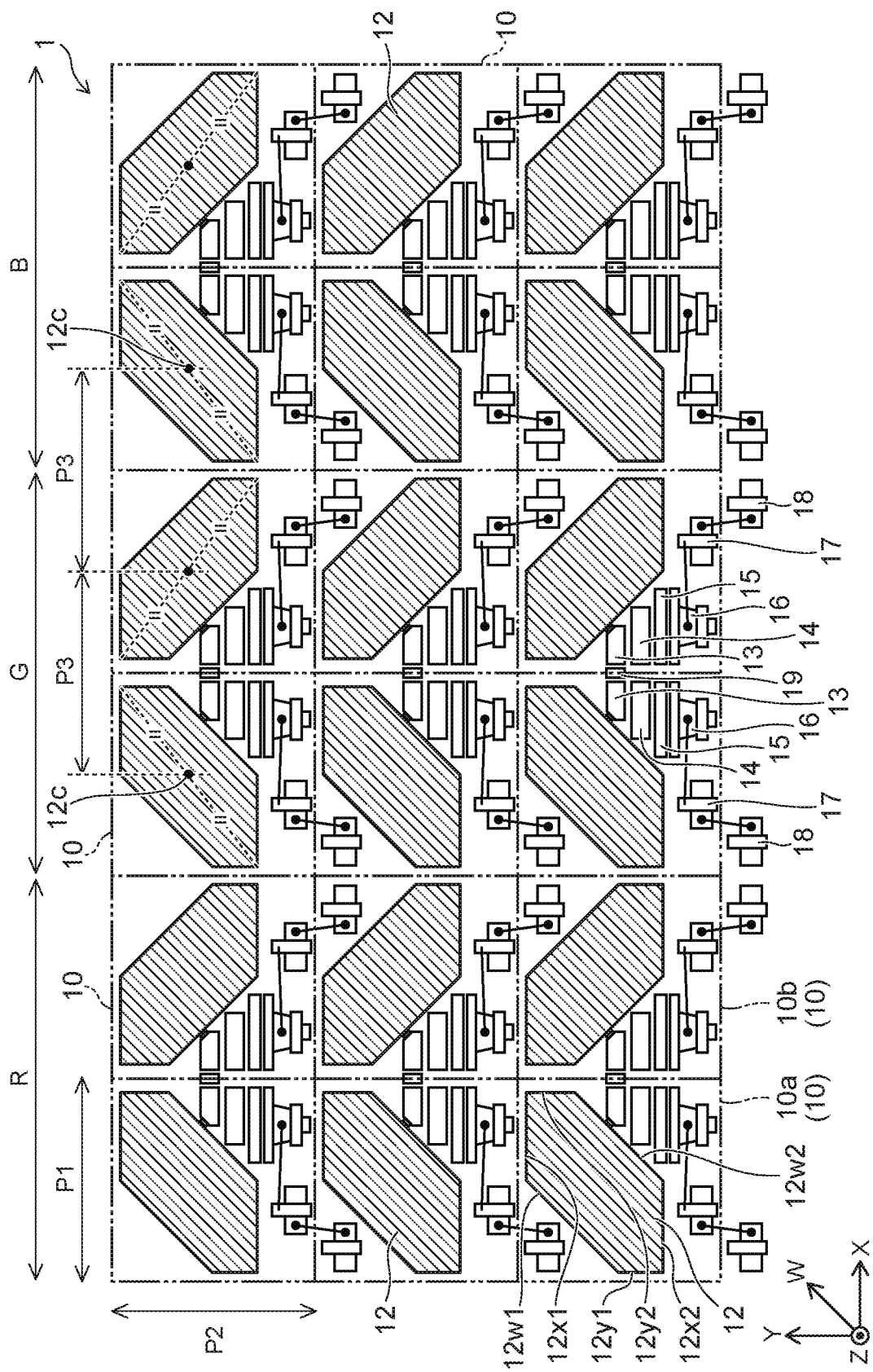
FIG. 1 is a plan view showing a solid state imaging device according to a first embodiment.

FIG. 1 is a plan view showing a solid state imaging device according to the embodiment.

As shown in FIG. 1, multiple pixels 10 are arranged in a matrix configuration along an X-direction and a Y-direction in the solid state imaging device 1 according to the embodiment. The X-direction and the Y-direction are mutually-orthogonal. Also, a direction orthogonal to the X-direction and the Y-direction is taken as a Z-direction. The planar configuration, i.e., the configuration when viewed from the Z-direction, of each of the pixels 10 is a rectangle made of two sides extending in the X-direction and two sides extending in the Y-direction. The arrangement period of the pixels 10 in the X-direction is taken as P1; and the arrangement period of the pixels 10 in the Y-direction is taken as P2.

The multiple pixels 10 are differentiated into a red region R, a green region G, and a blue region B. The pixels 10 are arranged in two columns along the Y-direction in each of the red region R, the green region G, and the blue region B (hereinbelow, generally called the "monochromatic regions").

The structure of each of the pixels 10 will now be described.

An opening region 12 is provided in each of the pixels 10. A photodiode is formed in the opening region 12. A signal charge is generated in the photodiode when light enters from the outside via the opening region 12. The opening region 12 is disposed over the entire width in the X-direction of the pixel 10. "Disposed over the entire width" means that another element is not disposed between the end edge of the pixel 10 and the end edge in the X-direction of the opening region 12. Structure bodies that form a boundary with an adjacent pixel 10, margin regions based on the demands of manufacturing technology such as design rules, process conditions, etc., may be disposed between the end edge of the pixel 10 and the end edge in the X-direction of the opening region 12. Also, interconnects, etc., may be provided above, that is, on the Z-direction side, of the boundary between the pixels 10.

In the embodiment, the planar configuration of the opening region 12 is a hexagon having 2-fold rotational symmetry. In other words, the outer edge of the opening region 12 when viewed from the Z-direction is a hexagon made of the two sides of a side 12x1 and a side 12x2 extending in the X-direction, the two sides of a side 12y1 and a side 12y2 extending in the Y-direction, and the two sides of a side 12w1 and a side 12w2 extending in a W-direction orthogonal to the Z-direction and crossing the X-direction and the Y-direction. The length of the side 12x1 is equal to the length of the side 12x2; the length of the side 12y1 is equal to the length of the side 12y2; and the length of the side 12w1 is equal to the length of the side 12w2, The axis of symmetry of the opening region 12 is positioned at the X-direction center of the pixel 10.

The side 12x1 is disposed at the vicinity of an end edge of the pixel 10 extending in the X-direction; and the side 12x2 is disposed in the interior of the pixel 10. The side 12y1 and the side 12y2 are disposed at the vicinities of two end edges of the pixel 10 extending in the Y-direction. The side 12w1 and the side 12w2 are disposed in the interior of the pixel 10. The side 12w1 contacts the side 12x1 and the side 12y1. The side 12w2 contacts the side 12x2 and the side 12y2.

Other than the opening region 12, a transfer gate 13, a charge storage portion 14, a transfer gate 15, a floating junction 16, a drive transistor 17, and an address transistor 18 are provided in the pixel 10. Components other than those recited above may be provided in the pixel 10.

In the embodiment, the transfer gate 13, the charge storage portion 14, and the transfer gate 15 are disposed in a region inside the pixel 10 opposing the side 12w2. The floating junction 16 is disposed in a region inside the pixel 10 between the region opposing the side 12w2 and a region opposing the side 12x2. The drive transistor 17 is disposed in the region inside the pixel 10 opposing the side 12x2. The address transistor 18 is disposed in a region inside a pixel 10 adjacent in the Y-direction and opposes the side 12w1 of the opening region 12 of the adjacent pixel 10.

Among the pixels 10 belonging to each of the monochromatic regions, the structures of the two pixels 10 adjacent to each other in the X-direction are mirror images of each other with respect to a YZ plane including the boundary between the two pixels 10. In FIG. 1, a pixel 10a and a pixel 10b are shown as an example of two such pixels 10. Between the two pixels 10, the transfer gates 13, the charge storage portions 14, the transfer gates 15, and the floating junctions 16 are disposed adjacent to each other with the boundary between the two pixels 10 interposed. Also, a common transfer gate 19 is provided between the transfer gates 13 of the two pixels 10.

Operations of the embodiment will now be described.

The solid state imaging device 1 according to the embodiment can select a high-resolution imaging mode and a high-sensitivity imaging mode. In the high-resolution imaging mode, one pixel 10 is driven as one imaging element. In the high-sensitivity imaging mode, two pixels 10, e.g., the pixel 10a and the pixel 10b shown in FIG. 1, belonging to each of the monochromatic regions and being adjacent to each other in the X-direction are driven as one imaging element. In the high-sensitivity imaging mode, the total amount of the signal charge stored in the opening region 12 of the pixel 10a and the signal charge stored in the opening region 12 of the pixel 10b is detected. In the high-resolution imaging mode, the resolution is higher but the sensitivity is lower than in the high-sensitivity imaging mode. Conversely, in the high-sensitivity imaging mode, the sensitivity is higher but the resolution is lower than in the high-resolution imaging mode. The operations of the pixels 10 are described in a reference example described below.

Effects of the embodiment will now be described.

In the embodiment, because the opening region 12 is disposed over the entire width in the X-direction of the pixel 10, a center 12c of the opening region 12 in the X-direction substantially matches the center of the pixel 10. Therefore, the distance between the centers 12c in the X-direction of the opening regions 12 of the multiple pixels 10 arranged along the X-direction is equal to the arrangement period P1 of the pixels 10. In other words, P3=P1, where P3 is the arrangement period of the opening regions 12 in the X-direction, Thus, the distance between the centers of the opening regions 12 between the mutually-adjacent imaging elements is constant (P3); therefore, in the case of imaging in the high-resolution imaging mode, the resolution of the image improves. Also, even in the case where the image that is imaged on the imaging surface of the solid state imaging device 1 includes a pattern having a period of about P3, a moiré effect does not occur easily. As a result, even in the high-resolution imaging mode, a high-quality imaging image can be obtained.

In the embodiment, the outer edge of the opening region 12 is a hexagon having 2-fold rotational symmetry with respect to an axis positioned at the X-direction center of the pixel 10. Thereby, a wide space is formed between the opening regions 12 between the two pixels 10 belonging to the same monochromatic region and being adjacent to each other in the X-direction, Therefore, the transfer gates 13 can be disposed proximally to each other. As a result, as described below, the two mutually-adjacent pixels 10 can be driven as one imaging element; and the high-sensitivity imaging mode is possible. Also, the centroid of the opening region 12 can be disposed in the X-direction center of the pixel 10; and the centroids of the opening regions 12 can be arranged periodically along the X-direction. As a result, the quality of the imaging image in the high-resolution imaging mode is higher. In the example shown in FIG. 1, the centroid of the opening region 12 matches the center 12c in the X-direction and matches the axis of symmetry of the opening region 12.

Second Embodiment

A second embodiment will now be described.

Figure 2:
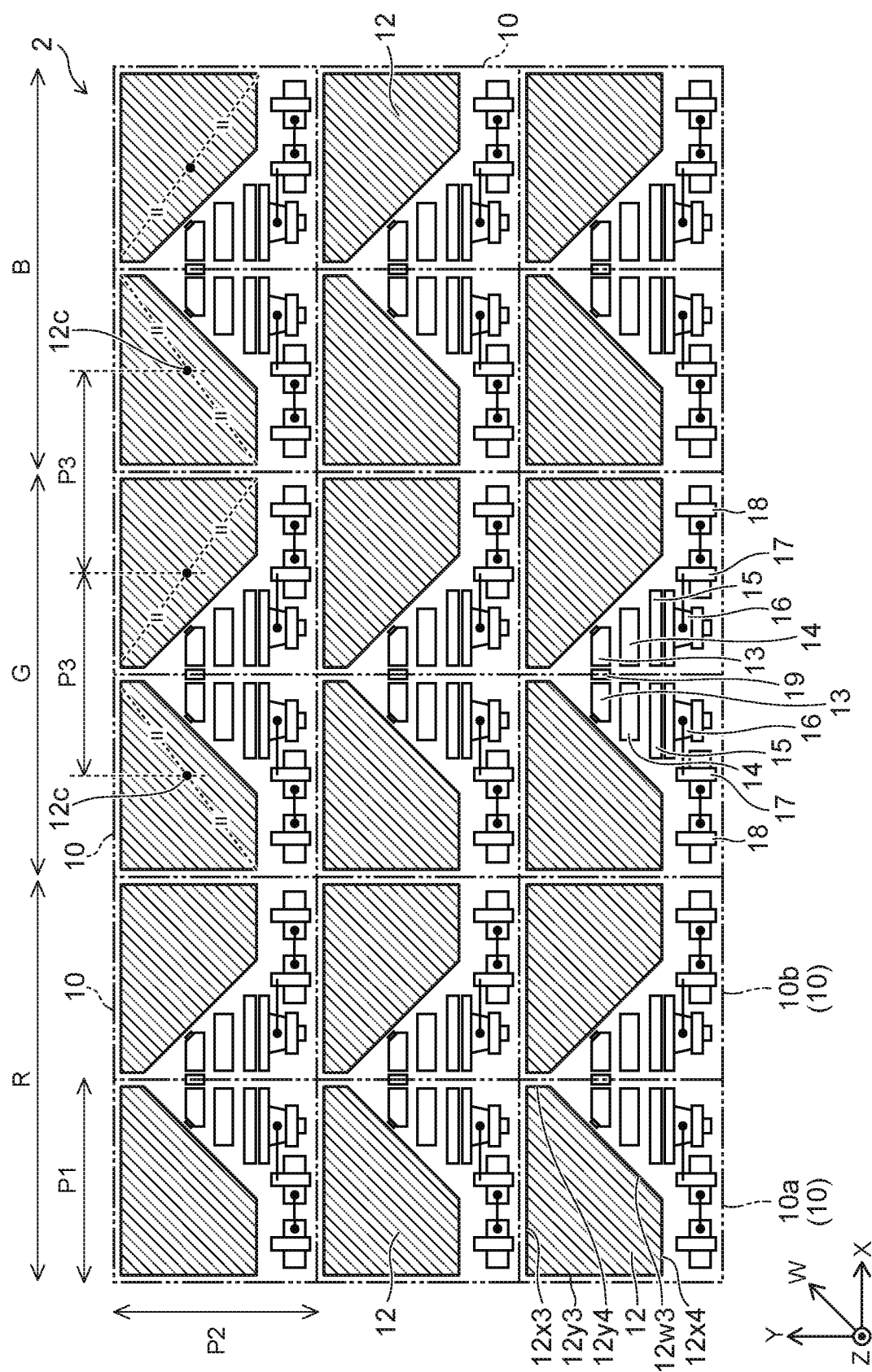
FIG. 2 is a plan view showing a solid state imaging device according to a second embodiment.

FIG. 2 is a plan view showing a solid state imaging device according to the embodiment.

As shown in FIG. 2, in the solid state imaging device 2 according to the embodiment as well, similarly to the first embodiment described above (referring to FIG. 1), the structure of the two pixels 10 belonging to the same monochromatic region and being adjacent to each other in the X-direction are mutually mirror-symmetric. For example, in the example shown in FIG. 2, the pixel 10a and the pixel 10b are mutually mirror-symmetric. Also, the opening region 12 is disposed over the entire width in the X-direction of the pixel 10.

Compared to the first embodiment, the layout inside each of the pixels 10 is different in the embodiment. In each of the pixels 10, the outer edge of the opening region 12 is a right-pentagon. In other words, the outer edge of the opening region 12 is made of the two sides of a side 12x3 and a side 12x4 extending in the X-direction, the two sides of a side 12y3 and a side 12y4 extending in the Y-direction, and one side 12w3 extending in the W-direction. The side 12x3 is disposed at the vicinity of an end edge of the pixel 10 extending in the X-direction; and the side 12x4 is disposed in the interior of the pixel 10. The side 12y3 and the side 12y4 are disposed at the vicinities of two end edges of the pixel 10 extending in the Y-direction. The side 12w3 is disposed in the interior of the pixel 10. The side 12x4 is shorter than the side 12x3; and the side 12y4 is shorter than the side 12y3. The side 12x3 and the side 12y3 contact each other. The side 12w3 contacts the side 12x4 and the side 12y4. In the embodiment, the address transistor 18 is disposed inside the same pixel 10 as the other components.

Effects of the embodiment will now be described.

In the embodiment as well, similarly to the first embodiment described above, the opening region 12 is disposed over the entire width in the X-direction of the pixel 10. Therefore, the center 12c of the opening region 12 in the X-direction can substantially match the center of the pixel 10; and the arrangement period P3 of the opening regions 12 can match the arrangement period P1 of the pixels 10. As a result, even in the high-resolution imaging mode, a high-quality imaging image can be obtained. However, in the embodiment, the centroid of the opening region 12 is different from the center 12c.

According to the embodiment, compared to the first embodiment, a wide space can be ensured inside the pixel 10 on one side of the opening region 12 in the Y-direction. Therefore, the address transistor 18 can be disposed inside the same pixel 10 as the other components; and the layout can be simplified.

Otherwise, the configuration, the operations, and the effects of the embodiment are similar to those of the first embodiment described above.

Third Embodiment

A third embodiment will now be described.

Figure 3:
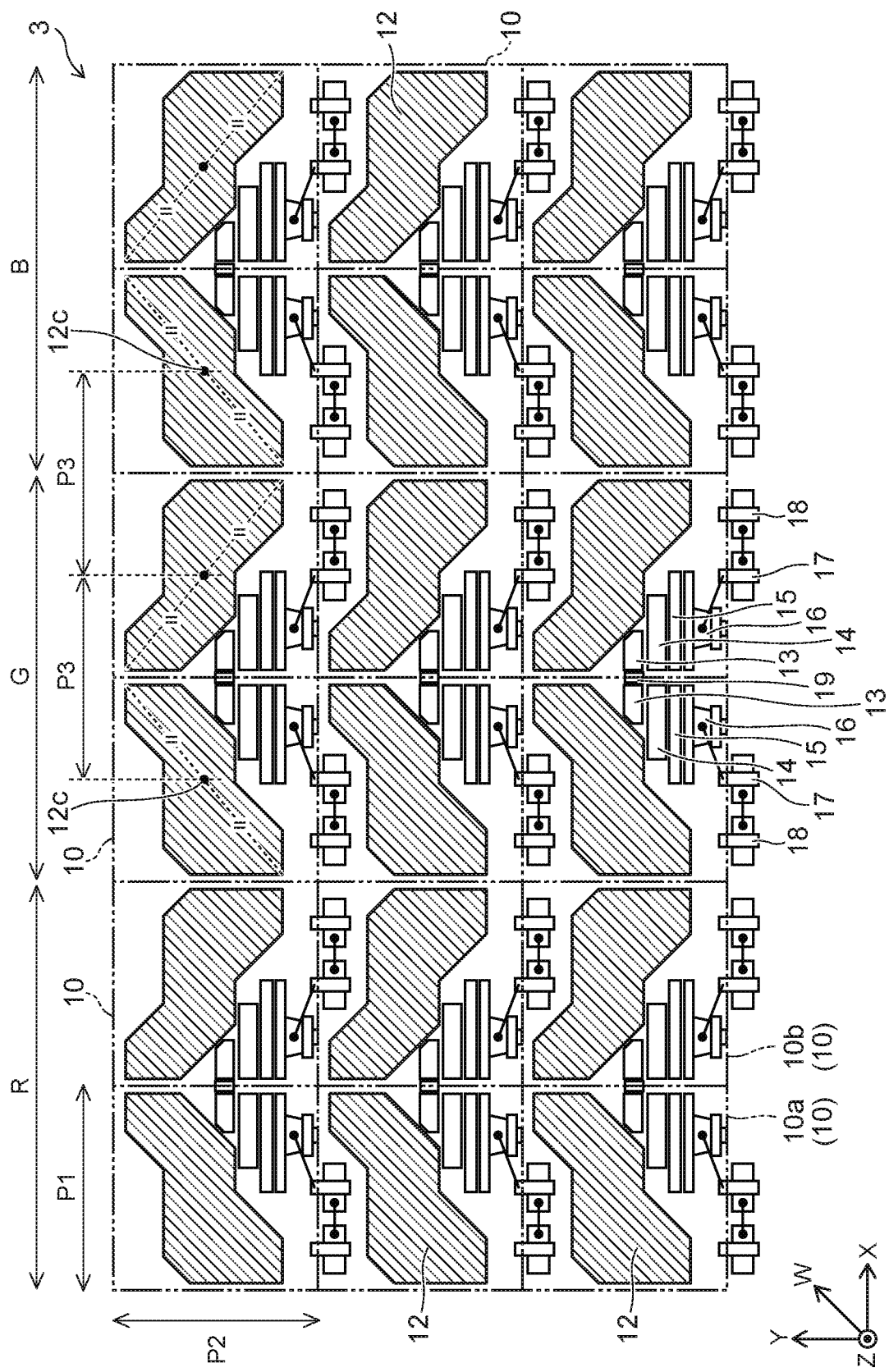
FIG. 3 is a plan view showing a solid state imaging device according to a third embodiment.

FIG. 3 is a plan view showing a solid state imaging device according to the embodiment.

In the solid state imaging device 3 according to the embodiment as shown in FIG. 3, the outer edge of the opening region 12 is a concave polygon and is, for example, a concave decagon. The opening region 12 is disposed over the entire width in the X-direction of the pixel 10. The drive transistor 17 and the address transistor 18 are disposed inside a pixel 10 adjacent in the Y-direction.

Effects of the embodiment will now be described.

By setting the configuration of the opening region 12 to be a concave polygon in the embodiment, the components such as the transfer gate 13, etc., can be disposed in the region opposing a reentrant angle. In other words, the configuration of the opening region 12 can be determined to match the arrangement of the components such as the transfer gate 13, etc., other than the opening region 12. Thereby, the space inside the pixel 10 can be effectively used; and the surface area ratio of the opening region 12 to the pixel 10 can be improved. By improving the surface area ratio of the opening region 12, the detection efficiency of the light increases.

Otherwise, the configuration, the operations, and the effects of the embodiment are similar to those of the first embodiment described above.

Fourth Embodiment

A fourth embodiment will now be described.

Figure 4:
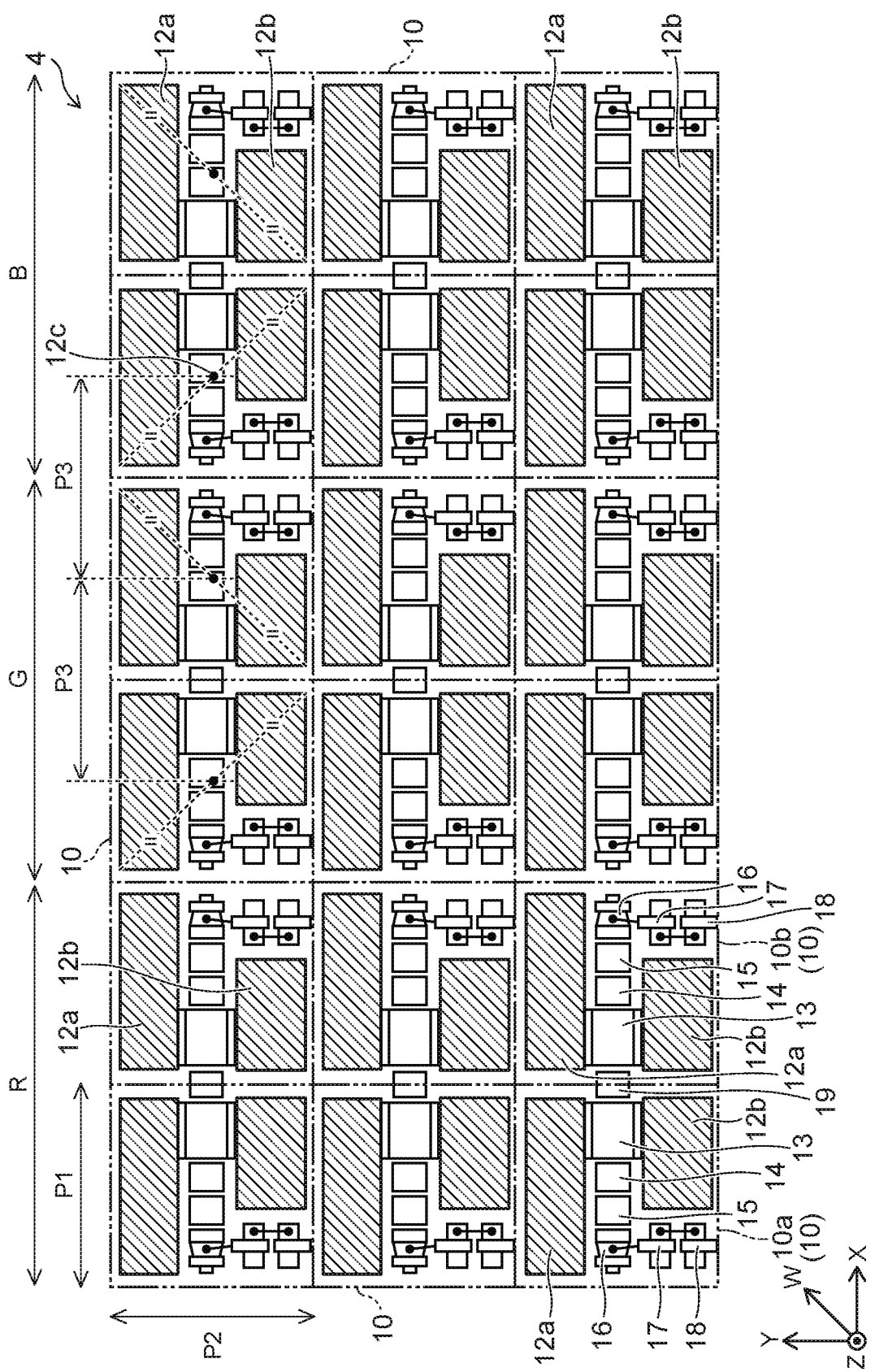
FIG. 4 is a plan view showing a solid state imaging device according to a fourth embodiment.

FIG. 4 is a plan view showing a solid state imaging device according to the embodiment.

In the solid state imaging device 4 according to the embodiment as shown in FIG. 4, two opening regions 12a and 12b are provided inside each of the pixels 10. The opening region 12a and the opening region 12b are separated from each other in the Y-direction. The configurations of the opening regions 12a and 12b each are rectangles; and the length in the X-direction of the opening region 12a is longer than the length in the X-direction of the opening region 12b. The opening region 12a is disposed over the entire width in the X-direction of the pixel 10.

The transfer gate 13 is connected to both the opening region 12a and the opening region 12b. The transfer gate 13, the charge storage portion 14, the transfer gate 15, and the floating junction 16 are arranged in this order along the X-direction inside the pixel 10. The floating junction 16, the drive transistor 17, and the address transistor 18 are arranged in this order along the Y-direction inside the pixel 10.

Effects of the embodiment will now be described.

By providing the two opening regions 12a and 12b inside one pixel 10 in the embodiment, the surface area ratio of the opening region 12 to the pixel 10 can be improved while setting the configurations of the opening regions to be simple rectangles.

Also, because the opening region 12a is disposed over the entire width in the X-direction of the pixel 10, the centers 12c of the opening regions 12a and 12b can substantially match the center of the pixel 10 in the X-direction; and the arrangement period P3 of the opening regions 12a and 12b can match the arrangement period P1 of the pixels 10.

Otherwise, the configuration, the operations, and the effects of the embodiment are similar to those of the first embodiment described above.

The embodiments described above also can be implemented in combination with each other. For example, similarly to the fourth embodiment, the opening regions may be multiply provided inside each of the pixels 10 in the first to third embodiments. Also, the first embodiment and the third embodiment can be combined; and the configuration of the opening region 12 may be a concave polygon having 2-fold rotational symmetry with respect to an axis positioned at the X-direction center of the pixel 10.

Reference Example

A reference example will now be described.

Figure 5:
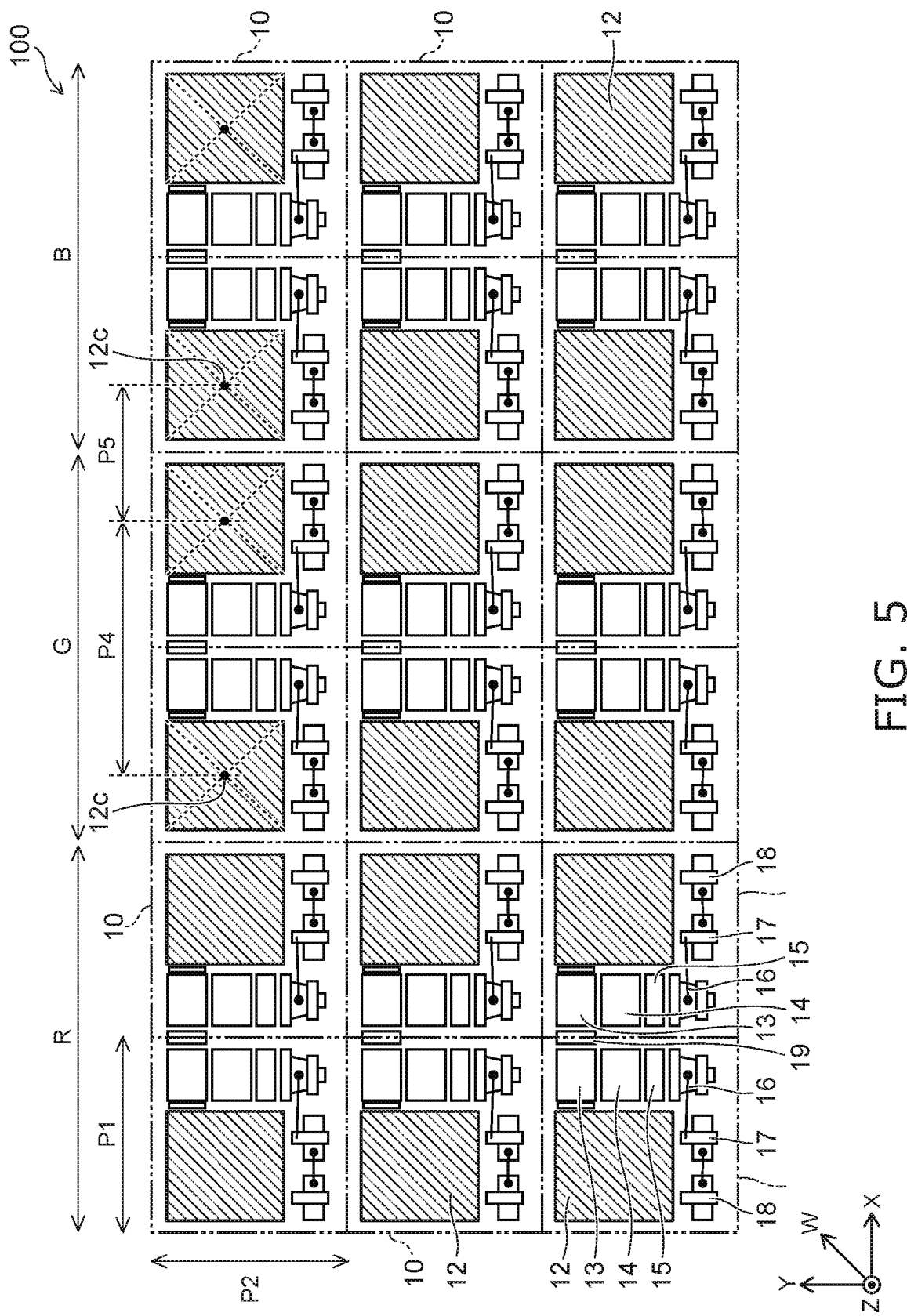
FIG. 5 is a plan view showing a solid state imaging device according to a reference example.

FIG. 5 is a plan view showing a solid state imaging device according to the reference example.

Figure 6A:
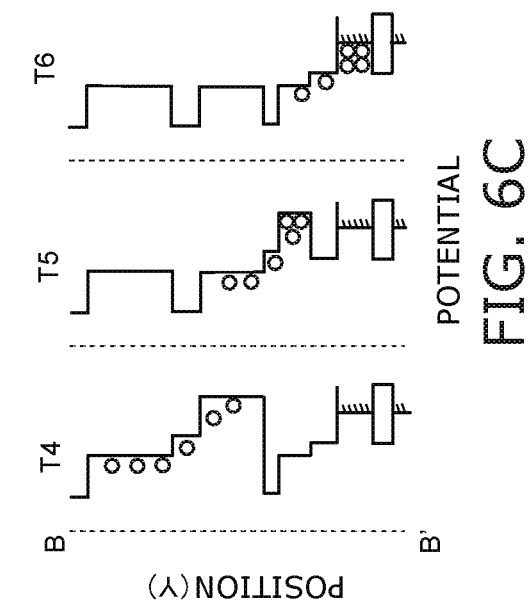
FIG. 6A is a plan view showing a pair of pixels of the solid state imaging device according to the reference example.
Figure 6C:
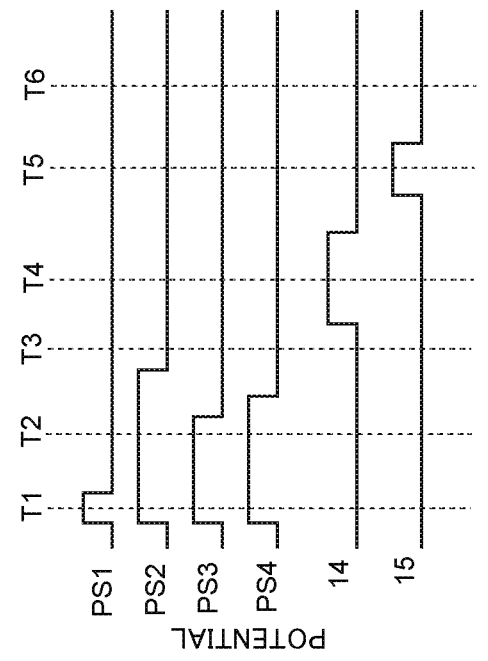
FIG. 6C is a potential diagram showing change of charge distribution, in which the vertical axis is position along line B-B' shown in FIG. 6A, and the horizontal axis is potential.
Figure 6B:
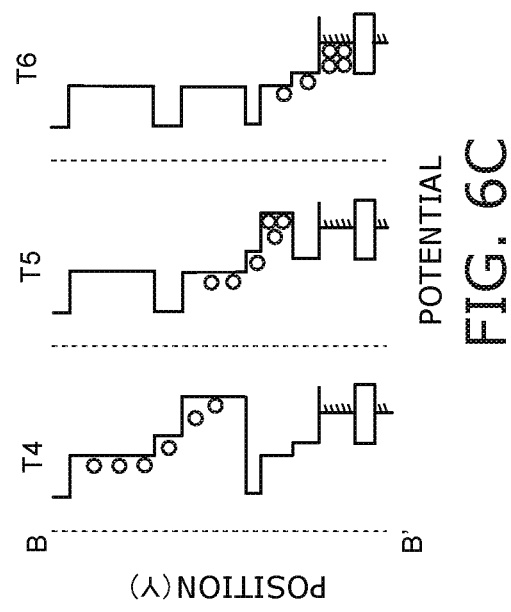
FIG. 6B is a potential diagram showing change of charge distribution, in which the horizontal axis is a position along line A-A' shown in FIG. 6A, and the vertical axis is a potential.
Figure 6D:
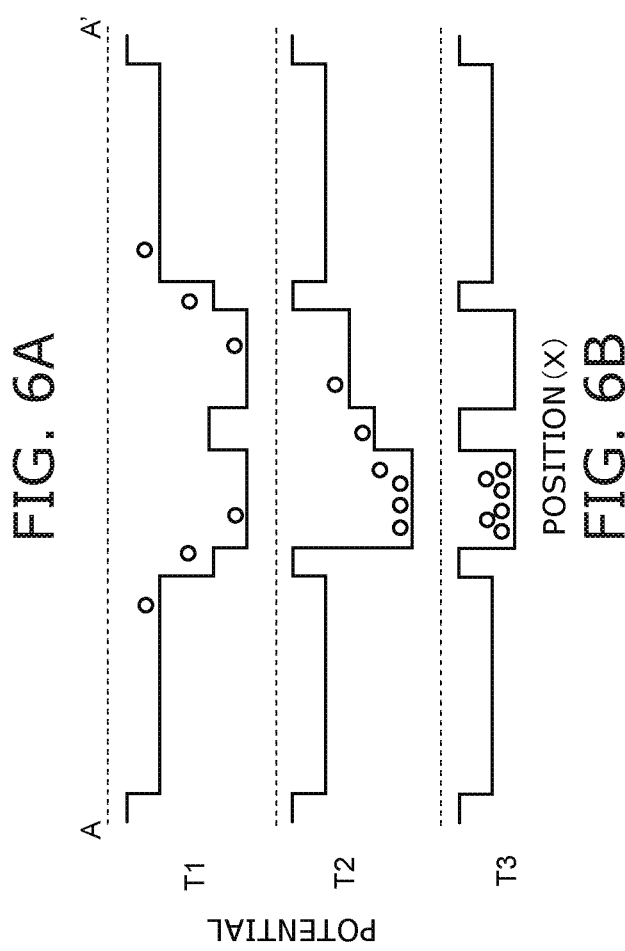
FIG. 6D is a timing chart showing potential change of each component, in which the horizontal axis is time and the vertical axis is potential.

FIG. 6A is a plan view showing a pair of pixels of the solid state imaging device according to the reference example; FIG. 6B is a potential diagram showing the change of the charge distribution, in which the horizontal axis is the position along line A-A' shown in FIG. 6A, and the vertical axis is the potential; FIG. 6C is a potential diagram showing the change of the charge distribution, in which the vertical axis is the position along line B-B' shown in FIG. 6A, and the horizontal axis is the potential; and FIG. 6D is a timing chart showing the potential change of each component, in which the horizontal axis is time and the vertical axis is the potential.

In the solid state imaging device 100 according to the reference example as shown in FIG. 5, the opening region 12 is disposed in a region on one X-direction side and one Y-direction side in each of the pixels 10. Also, the two pixels 10 adjacent to each other in the X-direction are mutually mirror-symmetric. Therefore, the distance between the centers 12c of the opening regions 12 in the X-direction has the values of two levels of a distance P4 and a distance P5. The distance P4 is longer than the arrangement period P1 of the pixels 10; and the distance P5 is shorter than the arrangement period P1. In other words, P4>P1>P5.

Thus, because the arrangement of the opening regions 12 is not periodic in the solid state imaging device 100 according to the reference example, the quality of the image when imaged in the high-resolution imaging mode degrades. For example, the resolution decreases locally at the portion corresponding to the distance P4. Also, in the case where a pattern that has an arrangement period of about P1 is included in the image imaged by the solid state imaging device 100, there is a possibility that the pattern may interfere with the arrangement of the opening regions 12; and a moiré effect may occur.

Operations of the pixel 10 in the high-sensitivity imaging mode will now be described.

The operations of the pixel 10 described below are similar in the embodiments described above as well.

First, when light is incident on the opening regions 12 of the pixel 10a and the pixel 10b, a signal charge is generated in the photodiodes provided in the opening regions 12.

Then, as shown in FIGS. 6A to 6D, at a time T1, potentials PS1 to PS4 all are set to an ON potential; and the signal charge of the opening region 12 is moved to the transfer gate 13 in both the pixel 10a and the pixel 10b.

At a time T2, the potential PS1 is set to an OFF-potential; and the opening region 12 and the transfer gate 13 are disconnected. Subsequently, by sequentially switching the potential PS3, the potential PS4, and the potential PS2 to the OFF-potential, the signal charge that is stored in the transfer gate 13 of the pixel 10b is moved to the transfer gate 13 of the pixel 10a. Thereby, at a time T3, the signal charge is trapped in the transfer gate 13 of the pixel 10a. Thus, the signal charge of the pixels 10a and 10b is synthesized.

The signal charge is moved from the transfer gate 13 of the pixel 10a to the charge storage portion 14 by setting the charge storage portion 14 to the ON potential at a time T4.

At a time T5, the signal charge is moved from the charge storage portion 14 of the pixel 10a to the transfer gate 15 by setting the charge storage portion 14 to the OFF-potential and by setting the transfer gate 15 to the ON potential. In FIG. 6D, the potential of the charge storage portion 14 is shown as the reference numeral "14;" and the potential of the transfer gate 15 is shown as the reference numeral "15."

The signal charge is moved to the floating junction 16 by setting the transfer gate 15 to the OFF-potential at a time T6. In the floating junction 16, the signal charge is converted into a potential; and the drive transistor 17 is set to the ON-state. Then, a signal potential that corresponds to the signal charge amount is read by the address transistor 18 being set to the ON-state by an external control circuit (not illustrated).

Thus, to perform the high-sensitivity imaging mode, it is necessary to move the signal charge of the pixel 10b to the pixel 10a. Therefore, it is necessary for the transfer gate 13 of the pixel 10a and the transfer gate 13 of the pixel 10b to be disposed at positions sandwiching the common transfer gate 19.

According to the embodiments described above, a solid state imaging device can be realized in which the quality of the imaging image is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A solid state imaging device, comprising a first pixel and a second pixel adjacent to each other in a first direction, structures of the first pixel and the second pixel being mutually mirror-symmetric,
    each of the first pixel and the second pixel including an opening region where light enters,
    the opening region of the first pixel being disposed over an entire width in the first direction of the first pixel,
    the opening region of the second pixel being disposed over an entire width in the first direction of the second pixel,
    the first pixel being driven as one imaging element and the second pixel being driven as another one imaging element in a high-resolution imaging mode, and
    a total amount of a signal charge stored in the opening region of the first pixel and a signal charge stored in the opening region of the second pixel being detected such that the first pixel and the second pixel are driven as one imaging element in a high-sensitivity imaging mode.

2. The device according to claim 1, wherein
    each of an outer edge of the first pixel and an outer edge of the second pixel is a rectangle made of two sides extending in the first direction and two sides extending in a second direction orthogonal to the first direction, and
    an outer edge of the opening region is a pentagon made of two sides extending in the first direction, two sides extending in the second direction, and one side extending in a third direction crossing the first direction and the second direction.

3. The device according to claim 1, wherein
    each of an outer edge of the first pixel and an outer edge of the second pixel is a rectangle made of two sides extending in the first direction and two sides extending in a second direction orthogonal to the first direction, and
    an outer edge of the opening region is a hexagon made of two sides extending in the first direction, two sides extending in the second direction, and two sides extending in a third direction crossing the first direction and the second direction.

4. The device according to claim 1, wherein
    each of an outer edge of the first pixel and an outer edge of the second pixel is a rectangle made of two sides extending in the first direction and two sides extending in a second direction orthogonal to the first direction, and
    an outer edge of the opening region is a concave polygon.

5. The device according to claim 1, wherein each of the first pixel and the second pixel includes another opening region separated from the opening region.

6. The device according to claim 1, wherein a distance between a center of the opening region of the first pixel and a center of the opening region of the second pixel in the first direction is equal to the width of the first pixel in the first direction.

7. A solid state imaging device, comprising a first pixel and a second pixel adjacent to each other in a first direction, structures of the first pixel and the second pixel being mutually mirror-symmetric,
    each of the first pixel and the second pixel including an opening region where light enters,
    an outer edge of the opening region of the first pixel having 2-fold rotational symmetry with respect to an axis positioned at the first-direction center of the first pixel,
    an outer edge of the opening region of the second pixel having 2-fold rotational symmetry with respect to an axis positioned at the first-direction center of the second pixel,
    the first pixel being driven as one imaging element and the second pixel being driven as another one imaging element in a high-resolution imaging mode, and
    a total amount of a signal charge stored in the opening region of the first pixel and a signal charge stored in the opening region of the second pixel being detected such that the first pixel and the second pixel are driven as one imaging element in a high-sensitivity imaging mode.

8. The device according to claim 7, wherein
    each of an outer edge of the first pixel and an outer edge of the second pixel is a rectangle made of two sides extending in the first direction and two sides extending in a second direction orthogonal to the first direction, and
    an outer edge of the opening region is a hexagon made of two sides extending in the first direction, two sides extending in the second direction, and two sides extending in a third direction crossing the first direction and the second direction.

9. The device according to claim 7, wherein
    each of an outer edge of the first pixel and an outer edge of the second pixel is a rectangle made of two sides extending in the first direction and two sides extending in a second direction orthogonal to the first direction, and an outer edge of the opening region is a concave polygon.

10. The device according to claim 7, wherein each of the first pixel and the second pixel includes another opening region separated from the opening region.

11. The device according to claim 7, wherein a distance between a center of the opening region of the first pixel and a center of the opening region of the second pixel in the first direction is equal to the width of the first pixel in the first direction.

12. A solid state imaging device, comprising a plurality of pixels arranged periodically along a first direction, structures of two pixels adjacent to each other in the first direction being mutually mirror-symmetric, each of the plurality of pixels including an opening region where light enters, the opening regions of the plurality of pixels being arranged periodically along the first direction, each of the plurality of pixels being driven as one imaging element in a high-resolution imaging mode, and a total amount of a signal charge stored in the opening regions of the two pixels adjacent to each other in the first direction such that the two pixels are driven as one imaging element in a high-sensitivity imaging mode.

\* \* \* \* \*